(12) United States Patent
Tobita et al.

(10) Patent No.: US 6,730,731 B2
(45) Date of Patent: May 4, 2004

(54) THERMALLY CONDUCTIVE POLYMER COMPOSITION AND THERMALLY CONDUCTIVE MOLDED ARTICLE

(75) Inventors: Masayuki Tobita, Tokyo (JP); Natsuko Ishihara, Tokyo (JP); Naoyuki Shimoyama, Tokyo (JP); Shinya Tateda, Tokyo (JP)

(73) Assignee: Polymatech Co., LTD, Tokyo (JP)

( * ) Notice: Subject to any disclaimer, the term of this patent is extended or adjusted under 35 U.S.C. 154(b) by 299 days.

(21) Appl. No.: 09/943,006

(22) Filed: Aug. 31, 2001

(65) Prior Publication Data

US 2002/0058743 A1 May 16, 2002

(30) Foreign Application Priority Data

Sep. 12, 2000 (JP) ........................................ 2000-276246

(51) Int. Cl.[7] .............................. C08J 3/00; C08K 3/04; C08K 9/00; C08L 7/00; D01F 9/12
(52) U.S. Cl. .................... 524/495; 423/447.2; 523/215; 524/496
(58) Field of Search ................................ 524/495, 496; 523/215; 423/447.2

(56) References Cited

U.S. PATENT DOCUMENTS 5,552,214 A * 9/1996 Kobomura et al.
6,303,095 B1 * 10/2001 Nishimura et al.

FOREIGN PATENT DOCUMENTS

| EP | 1041627 | 10/2000 |
|---|---|---|
| JP | 62-131033 A | 6/1987 |
| JP | 04246456 A | 9/1992 |
| JP | 05-017593 | 1/1993 |
| JP | 05-222620 | 8/1993 |
| JP | 05-247268 | 9/1993 |
| JP | 7-90725 | * 4/1995 |
| JP | 9283145 | 10/1997 |
| JP | 09-283955 | 10/1997 |
| JP | 10-298433 | 11/1998 |
| JP | 11-158378 | 6/1999 |
| JP | 11-279406 | 10/1999 |
| JP | 2000191812 | 7/2000 |

* cited by examiner

*Primary Examiner*—Patrick Niland
(74) *Attorney, Agent, or Firm*—Nath & Associates; Harold L. Novick; Derek Richmond

(57) ABSTRACT

A thermally conductive polymer composition includes polymer matrix such as thermoplastic resin or thermoplastic elastomer and a graphitized carbon fiber which serves as a thermally conductive filler. The graphitized carbon fiber is made from a mesophase pitch. The mesophase pitch is spun, infusibilized, carbonized, pulverized, and graphitized to form powdery graphitized carbon fibers. Preferably, the graphitized carbon fibers have a diameter of 5–20 $\mu$m, an average particle size of 10–500 $\mu$m, and a density of 2.20–2.26 g/cm$^3$. The composition may be molded to form a thermally conductive molded article such as a thermally conductive sheet. The thermally conductive polymer composition and thermally conductive molded article have high thermal conductivity and transfer large amounts of heat from electric or electronic parts.

14 Claims, 2 Drawing Sheets

THERMALLY CONDUCTIVE POLYMER COMPOSITION AND THERMALLY CONDUCTIVE MOLDED ARTICLE

BACKGROUND OF THE INVENTION

The present invention relates to a thermally conductive polymer composition that has high thermal conductivity and a thermally conductive molded article formed from such a composition. More particularly, the invention relates to a thermally conductive polymer composition and a thermally conductive molded article including specific graphitized carbon fibers for effectively diffusing heat from a variety of components of electronic hardware such as semiconductor elements, a power supply, a light source, and other parts.

With recent advancements, miniaturization, and lightening of electronic hardware, semiconductor packages have become more compact, more highly integrated and operate at higher speed. Therefore, heat generated by the electronic hardware is a very important issue. Generally, to remove the heat from heat-generating components, a printed circuit board is formed of metal or ceramic with good thermal conductivity. A thermal via hole for diffusing heat may be formed in the board. Semiconductor packages may be made of metal, ceramic, or resin with good thermal conductivity.

Further, to reduce thermal resistance between a heat source and a radiator or between a heat source and a metal heat transfer plate, polymer grease or a flexible thermally conductive polymer composition that has high thermal conductivity may be used. For example, polymer grease or a sheet material of the thermally conductive polymer composition may be placed between the above components. Otherwise, a heat diffusing plate or a housing is molded and formed of the thermally conductive polymer composition.

Such polymer compositions include a polymer matrix such as resin and rubber and a filler that has high thermal conductivity in the polymer matrix. Possible fillers include metal oxide, metal nitride, metal carbide, and metal hydroxide such as aluminum oxide, boron nitride, aluminum nitride, silicon nitride, magnesium oxide, zinc oxide, silicon carbide, quartz, and aluminum hydroxide. However, such compositions do not necessarily have sufficient thermal conductivity.

To improve thermal conductivity, various thermally conductive polymer matrices that are filled with carbon fibers of high thermal conductivity or graphite powders have been proposed.

For example, Japanese Unexamined Patent Publication No. 62-131033 discloses a thermally conductive molded product in which thermoplastic resin is filled with graphite powders. Japanese Unexamined Patent Publication No. 4-246456 discloses a polyester resin composition including carbon black or graphite. Japanese Unexamined Patent Publication No. 5-17593 discloses a thermally conductive molded product which has high mechanical strength and in which carbon fibers oriented in one direction are impregnated with graphite powders and thermosetting resin. Japanese Unexamined Patent Publication No. 5-222620 describes thermally conductive material of pitch-based carbon fibers having a specific cross-sectional structure.

Japanese Unexamined Patent Publication No. 5-247268 discloses a rubber composition in which synthetic graphite having a particle size of 1–20 μm is mixed. Japanese Unexamined Patent Publication No. 9-283955 discloses a thermally conductive sheet in which graphitized carbon fibers of particular aspect ratio are dispersed in a polymer such as silicone. Japanese Unexamined Patent Publication No. 10-298433 discloses a composition and a radiation sheet in which spherical graphite powders having an interplanar spacing of 0.330–0.340 nm are mixed in silicone rubber.

Further, Japanese Unexamined Patent Publication No. 11-158378 discloses a silicone rubber composition that has electrical conductivity and thermal conductivity and in which heated graphite particles are mixed. Japanese Unexamined Patent Publication No. 11-279406 discloses a composition that has good electrical conductivity and thermal conductivity and in which carbon fibers of a given length are mixed in silicone rubber.

However, for advanced electronic parts, which generate a large amount of heat, there is a need for much higher thermal conductivity. The thermal conductivities of conventional thermally conductive polymer compositions and conventional thermally conductive sheets as described above are inadequate.

For example, Japanese Unexamined Patent Publication No. 9-283955 discloses a graphitized carbon fiber that serves as a thermally conductive filler. The graphitized carbon fiber is made by carbonizing, graphitizing, and pulverizing raw carbon fiber. After the pulverization, cracks occur in the axial direction of the fiber. The ratio of the cross-sectional area of the cracked surfaces of the pulverized fiber to the total cross-sectional area is large. In addition, a condensation polymerization reaction and a cyclization reaction during graphitization are slow to proceed. Therefore, thermal conductivities of the resulting polymer composition and the sheet are inadequate.

BRIEF SUMMARY OF THE INVENTION

An object of the present invention is to provide a thermally conductive polymer composition and a thermally conductive molded article that have high thermal conductivity and that effectively diffuse large amounts of heat that generate from electric or electronic parts.

A graphitized carbon fiber is made from a mesophase pitch. The fiber is obtained by spinning, infusibilizing, carbonizing, and pulverizing the mesophase pitch before graphitizing.

Other aspects and advantages of the invention will become apparent from the following description, taken in conjunction with the accompanying drawings, illustrating by way of example the principles of the invention.

BRIEF DESCRIPTION OF THE SEVERAL VIEWS OF THE DRAWING

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1A:
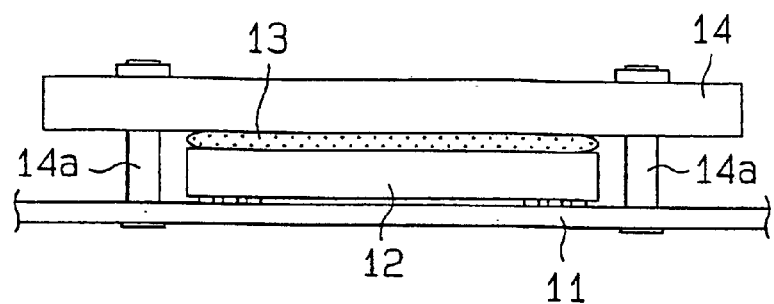
FIG. 1A is a side view of one application of a thermally conductive sheet.

Embodiments of the present invention are described in detail below. Throughout the description, the word "axial" means the direction in which the fibers extend.

A thermally conductive polymer composition includes a polymer matrix and graphitized carbon fibers as a thermally conductive filler. The graphitized carbon fibers are made from a mesophase pitch. The mesophase pitch is spun, infusibilized, carbonized, and pulverized. Then, the pulverized fibers are graphitized to form powdery graphitized carbon fibers.

The graphitized carbon fibers may be made from a mesophase pitch. The mesophase pitch is optically anisotropic. The mesophase pitch includes a petroleum pitch and a coal-tar pitch. The mesophase pitch may be used to produce a highly thermally conductive polymer composition and a highly thermally conductive molded article. Although the mesophase pitch may take any form as long as it is spinnable, a 100% pure mesophase pitch is preferred in terms of thermal conductivity, spinning and stability of product quality.

The pitch is melt-spun, infusibilized, carbonized, and pulverized by ordinary methods. The methods of melt-spinning the raw pitch include various methods such as melt spinning, melt blowing, centrifugal spinning, and eddy spinning. Among these methods, melt blowing is desirable in terms of productivity at spinning and quality of the resultant graphitized carbon fibers. In melt blowing, threads of carbon fibers are spun at low viscosity, not more than tens of poise, and rapidly cooled down. This facilitates an arrangement of graphite planes parallel with the axis of the fiber.

The diameter of spinning holes in melt blowing is preferably 0.1–0.5 mm, more preferably 0.15–0.3 mm. When the diameter of the holes is over 0.5 mm, the diameter of fibers becomes large, e.g., 25 $\mu$m or more, and diameter variations occur. This is undesirable in view of quality control. When the diameter of the holes is smaller than 0.1 mm, the holes tend to clog while spinning. Also, manufacture of spin nozzles is difficult.

For productivity, the spinning rate is preferably at least 500 m/min, more preferably at least 1500 m/min, and most preferably at least 2000 m/min. Although the spinning temperature varies depending on kinds of raw pitch, it is the same as or higher than the softening point of the pitch and below the temperature at which the pitch degenerates. The spinning temperature is generally 300–400 degrees C. and preferably 300–380 degrees C.

The softening point of raw pitch is not necessarily limited. However, in relation to the spinning temperature, lower softening point is advantageous. A lower softening point and faster infusibilizing rate are advantageous in terms of manufacturing costs and quality stability. The softening point of the raw pitch is preferably 230–350 degrees C. and more preferably 250–310 degrees C.

The pitch-based carbon fibers after spinning are infusibilized by ordinary methods. The infusibilization methods include, for example, heating the fibers in an oxidative atmosphere such as carbon dioxide or oxygen, treatment with an aqueous solution of an oxidative acid such as nitric acid and chromic acid, polymerization by light or gamma-rays. A simpler way of infusibilization is heating in air. The heating is conducted up to 350 degree C. at an average rate of increase of preferably at least 3 degree C./min, and more preferably at least 5 degree C./min although the rate slightly varies with different kinds of fibers.

The pulverization of the carbon fibers may be conducted immediately after the infusibilization. However, the pulverization is conducted preferably after the infusibilized fibers are lightly carbonized in an inert gas at a temperature of preferably 250–1500 degrees C., more preferably 500–900 degrees C. When the temperature is below 250 degree C., carbonization is insufficient. When the temperature is over 1500 degree C., the strength of the carbon fibers becomes too high to conduct pulverization. Lightly carbonized means that the temperature of the carbon fibers reaches substantially the appropriate temperature described above. Specifically, lightly carbonized means that the carbon fibers are subjected to an atmosphere of the above temperature for at least ten minutes. The infusibilized fibers are lightly carbonized at the above temperature before pulverization. This prevents axial cracks of the fibers after pulverization. Exposure of new graphite planes after pulverization facilitates condensation polymerization reaction and cyclization reaction during subsequent graphitization. Thus, a highly thermally conductive polymer composition and a highly thermally conductive molded article are produced.

As in a conventional way, if the spun fibers are graphitized at high temperature before the pulverization, cracks are likely to occur along the graphite planes that develop in the axial direction of the fibers. The ratio of the cross-sectional area of the cracked surfaces of the pulverized fibers to a total cross-sectional area becomes large. This prevents thermal conduction and is undesirable.

To pulverize fibers, pulverizing machines such as a Victory mill, a jet mill, and a high-speed rotation mill or cutters for chopping fibers are available. To make the pulverization effective, it is advantageous if a rotor of each machine that has blades is rotated at high speed to cut the fibers in a direction perpendicular to the fibers. The length of the pulverized fibers is changed by adjusting the rotation number of the rotor or an angle of the blades. Grinding machines such as a ball mill could be used for pulverizing the fibers. However, such machines are undesirable in that they apply perpendicular pressure to fibers, which generates cracks in the axial direction of the fibers.

The pulverized fibers are graphitized at high temperature to develop a graphite structure. The temperature of the graphitization process is preferably at least 2500 degree C., more preferably at least 2800 degree C., and still more preferably at least 3000 degree C. The resultant graphitized carbon fibers have an increased thermal conductivity in an axial direction of the fiber. The thermal conductivity is preferably at least 400W/m·K, more preferably, at least 800W/m·K, and still more preferably, at least 1000W/m·K.

The graphitized process provides powdery graphitized carbon fibers that keep fibrous shapes. Preferably the graphitized carbon fibers have a diameter of 5–20 $\mu$m, an average particle size of 10–500 $\mu$m, and a density of 2.20–2.26 g/cm$^3$. A thermally conductive polymer composition and a thermally conductive molded article formed of the graphitized carbon fibers that satisfy the above ranges are easily produced and have high thermal conductivity. The fibers that have a diameter of 5–20 $\mu$m are easily produced industrially. When the average particle size of each fiber is smaller than 10 $\mu$m, the contact of graphitized carbon fibers in the composition or the molded article is reduced and a heat transfer becomes insufficient. This reduces the thermal conductivity of the composition and the molded article. When the average particle size is larger than 500 $\mu$m, the graphitized carbon fibers are too bulky to be mixed in the polymer matrix at high concentration, which is undesirable.

More preferably, the diameter of the graphitized fibers is 5–15 μm and the average particle size of the graphitized fibers is 15–200 μm. More preferably, the diameter of the graphitized fibers is 8–12 μm and the average particle size of the graphitized fibers is 15–100 μm. The average particle size can be calculated from the particle size distribution by laser diffraction model.

When the density of the graphitized fibers is less than 2.20 g/cm$^3$, the graphitization becomes insufficient and the thermal conductivity of the thermally conductive polymer composition and the thermally conductive molded article is reduced. The ideal density of the graphite is 2.26 g/cm$^3$. A density greater than 2.26 g/cm$^3$ is infeasible.

The form of the graphitized carbon fibers may be an ordinary fiber, a scale, a whisker, a micro coil, or a nanotube.

The surface of the graphitized carbon fibers may be improved by oxidation such as electrolytic oxidation or treatment by agents such as a coupling agent and a sizing agent. For example, wettablity and filling efficiency of the fibers with respect to the polymer matrix can be improved. The peel strength from the polymer matrix at the interface can also be improved. The surface of the graphitized carbon fibers may be coated with metals or ceramics by methods such as physical vapor deposition, chemical vapor deposition, coating, immersion, and mechanochemical method in which fine particles are mechanically fixed on the surface. For example, the methods include electroless plating, electroplating, vacuum evaporation, sputtering, and ion plating.

In addition to the graphitized carbon fibers, the thermally conductive polymer composition may include the following materials.

- a filler that has high thermal conductivity used for conventional thermally conductive polymer compositions and conventional thermally conductive molded articles: the filler including powder- or fiber-shaped metal and ceramic such as silver, copper, gold, aluminum oxide, magnesium oxide, boron nitride, aluminum nitride, silicon nitride, silicon carbide, and aluminum hydroxide; and metal coated resin.
- conventional graphitized carbon fiber
- non-graphitized carbon fiber
- natural graphite
- synthetic graphite
- mesocarbon micro beads
- whisker-, micro coil- or nanotube-shaped carbon In an application where electric non-conductance is particularly required for an end product, the composition preferably includes at least one electrical insulative thermally conductive filler selected from the group consisting of aluminum oxide, magnesium oxide, boron nitride, aluminum nitride, silicon nitride, silicon carbide and aluminum hydroxide.

The composition may be solid or fluid. To decrease viscosity of the composition, the addition of a volatile organic solvent or a reactive practicizer is effective.

The polymer matrix is not limited and selected from ordinary thermoplastic resin, ordinary thermoplastic elastomer, ordinary thermosetting resin, and ordinary vulcanized rubber according to its use and required characteristics. For example, for a thermally conductive adhesive, adhesive polymer materials such as epoxy resin, polyimide resin, and acrylic resin are preferred. For a mold material, thermoplastic resin, thermosetting resin, and vulcanized rubber are preferred. Thermoplastic resin and thermoplastic elastomer are preferred since they are recyclable.

The thermoplastic resin includes polyethylene, polypropylene, ethylene α-olefin copolymer such as ethylene-propylene copolymer, polymethylpentene, polyvinyl chloride, polyvinylidene chloride, polyvinyl acetate, ethylene vinyl acetate copolymer, polyvinyl alcohol, polyacetal, fluororesins such as polyvinylidene fluoride and polytetrafluoroethylene, polyethylene terephthalate, polybutylene terephthalate, polyethylene naphthalate, polystyrene, polyacrylonitrile, styrene acrylonitrile copolymer, ABS resin, polyphenylene ether (PPE) and modified PPE resin, aliphatic and aromatic polyamides, polyimide, polyamide imide, polymethacrylic acid and polymethacrylates such as polymethyl methacrylate, polyacrylic acids, polycarbonate, polyphenylene sulfide, polysulfone, polyether sulfone, polyether nitrile, polyether ketone, polyketone, liquid crystal polymer, silicone resin, and ionomer.

The thermoplastic elastomer includes repeatedly moldable and recyclable thermoplastic elastomers such as styrene-butadiene or styrene-isoprene block copolymers and hydrogenated polymer thereof, styrene thermoplastic elastomer, olefin thermoplastic elastomer, vinyl chloride thermoplastic elastomer, polyester thermoplastic elastomer, polyurethane thermoplastic elastomer, and polyamide thermoplastic elastomer.

The thermosetting resin includes epoxy resin, polyimide, bis-maleimide resin, benzocyclobutene, phenol resin, unsaturated polyester, diallyl phthalate, silicone resin, polyurethane, polyimide silicone, thermosetting polyphenylene ether resin and modified PPE resin.

The vulcanized rubber and analogues thereof include natural rubber, butadiene rubber, isoprene rubber, styrene-butadiene copolymer rubber, nitrile rubber, hydrogenated nitrile rubber, chloroprene rubber, ethylene-propylene rubber, chlorinated polyethylene, chlorosulfonated polyethylene, butyl rubber and butyl rubber halide, fluorine rubber, urethane rubber, and silicone rubber.

In terms of temperature characteristics such as thermal resistance and electric reliability, the polymer is preferably at least one material selected from the group consisting of silicone rubber, epoxy resin, polyurethane, unsaturated polyester, polyimide, bis-maleimide, benzocyclobutene, fluororesin, thermoplastic resin and thermoplastic elastomer. More preferably, the polymer is at least one material selected from the group consisting of silicone rubber, epoxy resin, polyimide, polyurethane and thermoplastic elastomer.

In an application for a wiring board where permittivity and dielectric loss tangent are small and frequency characteristic is required, fluororesin, thermosetting polyphenylene ether resin, modified PPE resin, and polyolefin resin are desired. Further, a polymer alloy formed of a plurality of these polymer materials may be used. The methods of cross-linking thermosetting resin or vulcanized rubber are not limited to thermosetting but include known methods such as light setting and moist setting.

The content of graphitized carbon fibers in the polymer composition is preferably 20–500 parts by weight, more preferably 40–300 parts by weight, per polymer matrix of 100 parts by weight. When the content is less than 20 parts by weight, thermal conductivity of the resultant polymer composition and the molded article becomes low and this leads to inferior radiation. When the content is over 500 parts by weight, the viscosity of the composition increases so that the uniform dispersion of the graphitized carbon fibers in the polymer matrix is difficult. Gas bubbles are inevitably included.

The polymer matrix and a predetermined amount of graphitized carbon fibers are mixed and if necessary degassed to produce the intended thermally conductive polymer composition. In mixing, mixing devices such as a normal blender, a mixer, a roller, and an extruder may be used. Then the polymer composition may be processed by the methods such as compression molding, extrusion molding, injection molding, casting molding, blow molding, and calendering molding. When the composition is liquid, it may processed by painting, printing, dispensing, and potting other than the above methods.

Using compression molding, casting molding, extruding molding, blade molding, and calendaring molding, the composition is molded into a predetermined form such as a sheet to produce a thermally conductive molded article that has good radiation characteristics. When low hardness materials such as vulcanized rubber and thermoplastic elastomer are used as a polymer matrix, the molded article has good thermal conductivity and flexibility.

The hardness of the molded article depends on its purpose for use. For stress relaxation and tracking characteristics of the molded article, greater flexibility, or lower hardness, is advantageous. Specifically, the hardness of the molded body is preferably 70 or less using Shore A hardness. More preferably, the hardness is 40 or less using Shore A hardness. Most preferably, the molded body has an Asker C hardness of 30 or less and is a thermally conductive sheet as described below in which a gel silicone rubber or a thermoplastic elastomer is used as polymer matrix. The thickness of the sheet is not limited but it is preferably 50 $\mu$m–10 mm, and more preferably, 200 $\mu$m–5 mm. When the thickness is less than 50 $\mu$m, the sheet is hard to manufacture and handle. When the thickness is more than 10 mm, thermal resistance becomes great, which is undesirable.

The thermally conductive polymer composition may be used for a thermally conductive molded article such as a heat radiation plate, a thermally conductive sheet, a wiring board, a part for semiconductor package, a heat sink, a heat spreader and a housing.

Figure 1B:
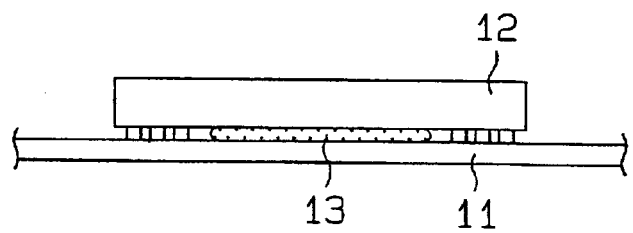
FIG. 1B is a side view of another application of the thermally conductive sheet.
Figure 1C:
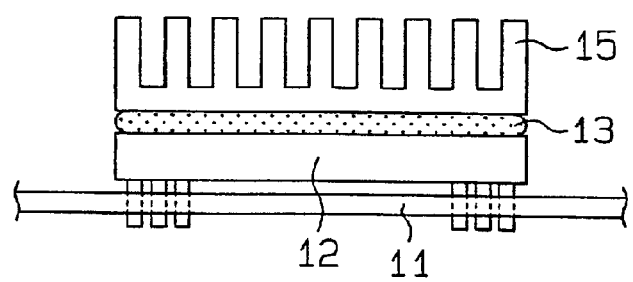
FIG. 1C is a side view of another application of the thermally conductive sheet.
Figure 1D:
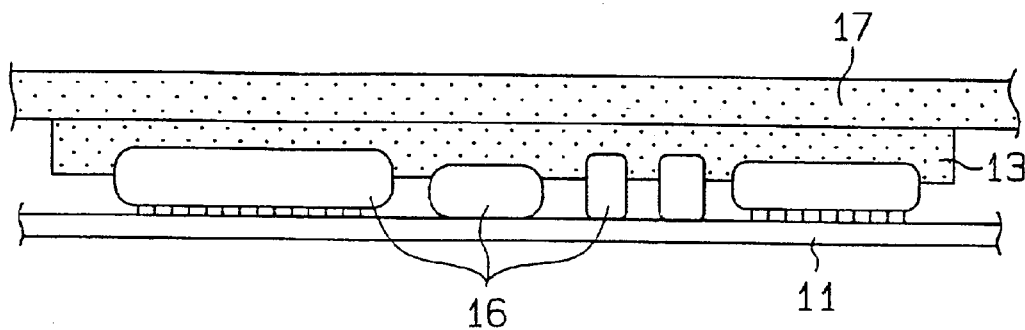
FIG. 1D is a side view of another application of the thermally conductive sheet and a thermally conductive housing.
Figure 2:
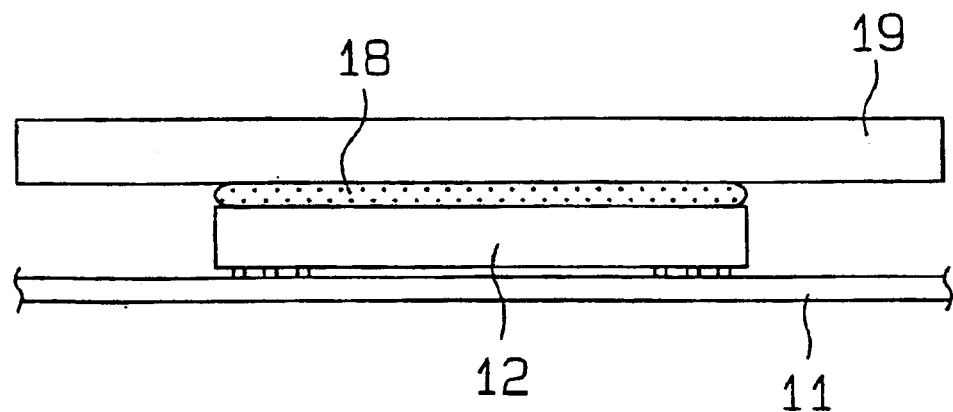
FIG. 2 is a side view of an application of a thermally conductive grease.
Figure 3:
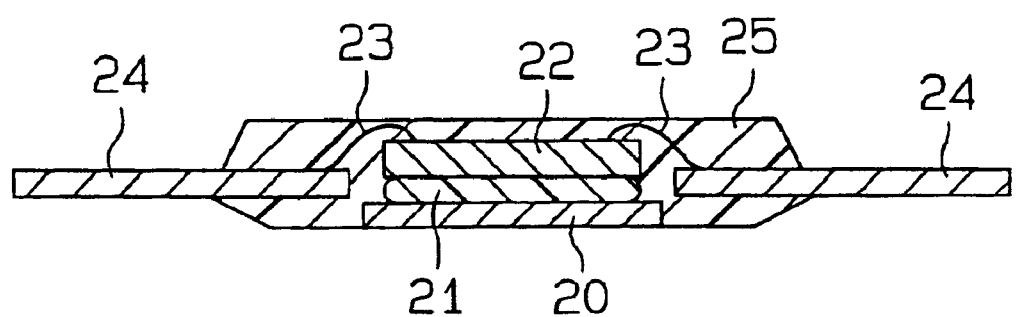
FIG. 3 is a side sectional view of an application of a thermally conductive adhesive.

The examples of the thermally conductive composition and the thermally conductive sheet are described in FIGS. 1 to 3. As shown in FIG. 1A, a semiconductor element 12 is placed on a printed circuit board 11. A radiator 14 is supported by the board 11 via a supporting member 14a to cover the semiconductor element 12. A thermally conductive sheet 13 as described above is placed between the semiconductor element 12 and the radiator 14. The sheet 13 conducts heat from the semiconductor element 12 to the radiator 14 to improve heat transfer.

As shown in FIG. 1B, the semiconductor element 12 is placed on the printed circuit board 11. The thermally conductive sheet 13 is placed between the board 11 and the semiconductor element 12.

As shown in FIG. 1C, the semiconductor element 12 is placed on the printed circuit board 11. The thermally conductive sheet 13 is mounted on the semiconductor element 12. A heat sink 15 is mounted on the thermally conductive sheet 13. The heat sink 15 is injection-molded from the thermally conductive polymer composition. The heat sink 15 has fins on its top.

As shown in FIG. 1D, packaging parts 16 are provided on the printed circuit board 11. A housing 17 is mounted on the packaging parts 16 via the thermally conductive sheet 13. The housing 17 is injection-molded from the thermally conductive polymer composition.

As shown in FIG. 2, the semiconductor element 12 is placed on the printed circuit board 11. A heat spreader 19 is placed on the semiconductor element 12, and thermally conductive grease 18 is located between the spreader 19 and the element 12. The grease 18 is paste and is formed of the thermally conductive polymer composition.

As shown in FIG. 3, a semiconductor chip 22 is adhered to a die pad 20 with a thermally conductive adhesive 21. The adhesive 21 is paste and is formed of the thermally conductive polymer composition. The chip 22 is connected to lead frames 24 with bonding wires 23. The parts 20 to 24 are encapsulated with an encapsulant 25.

As shown in FIGS. 1 to 3, the thermally conductive sheet 13, the thermally conductive grease 18 or the thermally conductive adhesive 21 formed of the thermally conductive polymer composition is placed between the heated element, which may be the semiconductor element 12, a power supply, or a light source, and the conductive member, which may be the radiator 14, a cooler, the heat sink 15, the heat spreader 19, the die pad 20, the printed circuit board 11, a cooling fan, a heating pipe, or the housing 17 to manufacture electronic parts. Thus, measures to remove heat are taken.

The advantages of the above embodiments are described below.

The thermally conductive polymer composition of the embodiments is carbonized and pulverized before being graphitized. Thus, axial cracks of the fibers after the pulverization are prevented. Exposure of new graphite planes upon pulverization facilitates condensation polymerization reaction and cyclization reaction during graphitization at a higher temperature. Thus, a highly thermally conductive polymer composition and a highly thermally conductive molded article are produced. Large amounts of heat that generate from electric or electronic parts are diffused effectively.

The graphitized carbon fibers have a diameter of 5–20 $\mu$m, an average particle size of 10–500 $\mu$m, and a density of 2.20–2.26 g/cm$^3$. This facilitates manufacture of the thermally conductive polymer composition and improves its thermal conductivity.

The composition is molded into a predetermined form such as a sheet by injection molding or extrusion molding. Thus, the production of the thermally conductive molded article is easy.

EXAMPLE

The above embodiments will be described by way of examples. The invention is not limited in any way by the examples.

Sample 1, Present Graphitized Carbon Fiber

A petroleum mesophase pitch that is optically anisotropic and has the specific gravity of 1.25 was used as a raw material. A die, which includes the 3 mm wide slits between which passages with 0.2 mm $\phi$ diameter spinning holes are arranged, was used. The mesophase pitch was melted and blown by the heated air out of the slits. The melted pitch was spun at a spinning temperature of 360 degree C. to produce pitch-based fibers having an average diameter of 13 $\mu$m. The spun fibers were collected on the belt as a mat. The mat was heated in the air from a room temperature to 300 degree C. at an average rising rate of 6 degree C./min to infusibilize the fibers. Then the infusibilized fibers were lightly carbodized at 700 degree C. and pulverized with a high-speed rotation mill to form pulverized carbon fibers.

The pulverized fibers were heated in an argon gas up to 2300 degree C., kept at 2300 degree C. for 40 minutes, further heated up to 3100 degree C. at a rising rate of 3 degree C./min, kept at 3100 degree C. for one hour, and cooled down to form powdery graphitized carbon fibers (sample 1). The measurements of density, fiber diameter, and average particle size of Sample 1 are shown in Table 1. The thermal conductivity of the fibers in axial direction was measured on the graphitized mat before pulverization. The measured value was 1100W/m·K.

Sample 2, Conventional Graphitized Carbon Fiber

A petroleum mesophase pitch that is optically anisotropic and has the specific gravity of 1.25 was used as a raw material. A die, which includes the 3 mm wide slits between which passages with 0.2 mm φ diameter spinning holes are arranged, was used. The mesophase pitch was melted and blown by the heated air out of the slit. The melted pitch was spun at a spinning temperature of 360 degree C. to produce pitch-based fibers having an average diameter of 13 μm. The spun fibers were collected on the belt as a mat. The mat was heated in the air from a room temperature to 300 degree C. at an average rising rate of 6 degree C./min to infusibilize the fibers. Then the infusibilized fibers were lightly carbodized at 700 degree C. Then the carbonized fibers were heated in an argon gas up to 2300 degree C., kept at 2300 degree C. for 40 minutes, further heated up to 3100 degree C. at a rising rate of 3 degree C./min, kept at 3100 degree C. for one hour, and cooled down to form graphitized carbon fibers. The thermal conductivity of the graphitized fibers was measured. The measured value was 1100W/m·K.

The graphitized carbon fibers were then pulverized with a high-speed rotation mill to form powdery pulverized carbon fibers (Sample 2). When these fibers were observed under an electron microscope, it was found that the fibers cracked in the axial direction. The measurements of density, fiber diameter, and average particle size of Sample 2 are shown in Table 1.

For comparison, commercially available long fibers formed of pitch-based graphitized cabon was used. The fibers were pulverized with a high-speed rotation mill to form pulverized fibers of Samples 3 and 4. Sample 3 was made from the graphitized carbon fibers (the axial thermal conductivity: 1000W/m·K) of MITSUBISHI CHEMICAL CORPORATION. Sample 4 was made from the graphitized carbon fibers (the axial thermal conductivity: 800W/m·K) of Nippon Graphite Fiber Corp. When the graphitized carbon fibers of Samples 3 and 4 were observed under an electron microscope, it was found that both fibers cracked in the axial direction. The measurements of density, fiber diameter, and average particle size of Samples 3 and 4 are shown in Table 1.

TABLE 1

|  | Sample 1 | Sample 2 | Sample 3 | Sample 4 |
|---|---|---|---|---|
| density (g/cm$^3$) | 2.24 | 2.23 | 2.19 | 2.19 |
| fiber diameter (μm) | 9.0 | 8.7 | 7.0 | 6.9 |
| average article size (μm) | 25 | 16 | 22 | 25 |

Example 1

The 100 parts by weight of addition-type liquid silicone rubber (Dow Corning Toray Silicone Co., Ltd.), 200 parts by weight of graphitized carbon fibers of Sample 1, the surface of which being treated with a silane coupling agent, 40 parts by weight of aluminum oxide powders (SHOWA DENKO K.K.), and 20 parts by weight of aluminum hydroxide powders (SHOWA DENKO K.K.) were mixed and dispersed to prepare a thermally conductive polymer composition. The composition was hot-pressed to form a thermally conductive sheet that has a thickness of 2 mm. The Asker C hardness of the sheet was 17. The thermal conductivity in the direction perpendicular to the seat was 3.5W/m·K.

Comparison 1

A thermally conductive polymer composition was prepared as in Example 1 except that the Sample 2 was used as graphitized fibers. The composition was hot-pressed to form a thermally conductive sheet which has a thickness of 2 mm. The Asker C hardness of the sheet was 15. The thermal conductivity in the direction perpendicular to the seat was 3.1W/m·K.

Comparison 2

A thermally conductive polymer composition was prepared as in Comparison 1 except that the Sample 3 was used as graphitized fibers. The composition was hot-pressed to form a thermally conductive sheet which has a thickness of 2 mm. The Asker C hardness of the sheet was 17. The thermal conductivity in the direction perpendicular to the seat was 2.9W/m·K.

Comparison 3

A thermally conductive polymer composition was prepared as in Comparison 1 except that the Sample 4 was used as graphitized fibers. The composition was hot-pressed to form a thermally conductive sheet which has a thickness of 2 mm. The Asker C hardness of the sheet was 16. The thermal conductivity in the direction perpendicular to the seat was 2.9W/m·K.

Example 2

The 100 parts by weight of low hardness styrene thermoplastic elastomer (RIKEN VINYL INDUSTRY CO., LTD.), 120 parts by weight of graphitized carbon fibers of Sample 1, 20 parts by weight of boron nitride powders (DENKI KAGAKU KOGYO KK.), and 20 parts by weight of aluminum hydroxide powders (SHOWA DENKO K.K.) were mixed by a twin screw extruder to prepare a pellet-form thermally conductive polymer composition. The composition was extrusion-molded to form a thermally conductive sheet that has a thickness of 3 mm. The Shore A hardness of the sheet was 68. The thermal conductivity was 2.5W/m·K.

Comparison 4

A thermally conductive polymer composition was prepared as in Example 2 except that the Sample 2 was used as graphitized fibers. The composition was extrusion-molded to form a thermally conductive sheet that has a thickness of 3 mm. The Shore A hardness of the sheet was 68. The thermal conductivity was 1.8W/m·K.

Example 3

The 100 parts by weight of polyacetal resin (Asahi Kasei Corporation) as a polymer matrix, 80 parts by weight of graphitized carbon fibers of Sample 1, the surface of which being treated with a silane coupling agent, and 20 parts by weight of aluminum oxide powders (SHOWA DENKO K.K.) were mixed by a twin screw extruder to form a pellet-form thermally conductive polymer composition. The composition was injection-molded to form a thermally conductive molded article that has a thickness of 3 mm. The thermal conductivity of the molded article was 1.7W/m·K.

Comparison 5

A thermally conductive polymer composition was prepared as in Example 3 except that the Sample 3 was used as graphitized fibers. The composition was injection-molded to form a thermally conductive molded article that has a thickness of 3 mm. The thermal conductivity of the molded article was 1.4W/m·K.

Example 4

The 100 parts by weight of bis-phenol type F epoxy resin (YUKA SHELL EPOXY CO.,LTD) including an amine hardening that serves as an adhesive polymer, 160 parts by weight of graphitized carbon fibers of Sample 1, the surface of which being treated with a silane coupling agent, and 20 parts by weight of aluminum oxide powders (SHOWA DENKO K.K.) were mixed to prepare an adhesive thermally conductive polymer composition. The composition was thermally hardened to form a plate-like specimen that has a thickness of 1 mm. The thermal conductivity of the specimen was 2.8W/m·K.

Comparison 6

A thermally conductive polymer composition was prepared as in Example 4 except that the Sample 4 was used as graphitized fibers. The composition was thermally hardened to form a plate-like specimen that has a thickness of 1 mm. The thermal conductivity of the specimen was 2.2W/m·K.

Example 5

As already shown in FIG. 1C, the semiconductor element 12 was placed on the printed circuit board 11. The thermally conductive sheet 13 of Example 1 is placed between the semiconductor element 12 and the heat sink 15 to assemble a semiconductor device. The thermal resistance of the semiconductor device was measured 10 minutes after energization. The measured value was 0.15 degree C./W.

Comparison 7

As in Example 5, the thermally conductive sheet of Comparison 1 is placed between the semiconductor element 12 and the heat sink 15 to assemble a semiconductor device. The thermal resistance of the semiconductor device was measured 10 minutes after energization. The measured value was 0.22 degree C./W.

|  | thermal conductivity (W/m · K) | thermal resistance (degree C/W) |
|---|---|---|
| Example 1 | 3.5 |  |
| Comparison 1 | 3.1 |  |
| Comparison 2 | 2.9 |  |
| Comparison 3 | 2.9 |  |
| Example 2 | 2.5 |  |
| Comparison 4 | 1.8 |  |
| Example 3 | 1.7 |  |
| Comparison 5 | 1.4 |  |
| Example 4 | 2.8 |  |
| Comparison 6 | 2.2 |  |
| Example 5 |  | 0.15 |
| Comparison 7 |  | 0.22 |

All the thermally conductive polymer compositions of Examples 1 to 4 have good thermal conductivity. Further, placement of the thermally conductive sheet of Example 5 between semiconductor element 12, which requires high thermal conductivity, and heat sink 15 lowers thermal resistance. Accordingly, even if the heat generated by the semiconductor element 12 is great, electronic parts can operate normally without suffering electrical disturbances.

In contrast, the graphitized carbon fibers of Comparisons 1 and 4 crack in the axial direction and the resultant compositions have the poor thermal conductivity. In Comparisons 2, 3, and 5 where commercially available long fibers that have high thermal conductivity were pulverized, the fibers crack in the axial direction and the thermal conductivity of the resultant compositions is low.

It should be apparent to those skilled in the art that the present invention may be embodied in many other specific forms without departing from the spirit or scope of the invention. Particularly, it should be understood that the invention may be embodied in the following forms.

The thermally conductive sheet 13 of the FIGS. 1B and 1C may be replaced with the thermally conductive adhesive 21 or the thermally conductive grease 18.

The supporting member 14a of FIG. 1A may be a thermally conductive molded article. Also, the encapsulant of FIG. 3 may be formed of thermally conductive polymer composition. These embodiments enhance the heat diffusion effect.

Therefore, the present examples and embodiments are to be considered as illustrative and not restrictive and the invention is not to be limited to the details given herein, but may be modified within the scope and equivalence of the appended claims.

What is claimed is:

1. A thermally conductive polymer composition comprising:
    a polymer matrix;
    graphitized carbon fibers as a thermally conductive filler,
        wherein the fibers are obtained by spinning, infusibilizing and carbonizing the mesophase pitch before pulverizing,
        wherein the graphitized carbon fibers have a density of 2.20–2.26 g/cm$^3$ and a thermal conductivity in an axial direction of the fiber of at least 400W/mK.

2. The composition in accordance with claim 1, wherein the graphitized carbon fibers have a diameter of 520 μm.

3. The composition in accordance with claim 1 wherein the graphitized carbon fibers have an average particle size of 10–500 μm.

4. The composition in accordance with claim 1, wherein the polymer matrix is selected from the group consisting of thermoplastic resin, thermoplastic elastomer, and thermosetting resin, and vulcanized rubber.

5. The composition in accordance with claim 1, wherein the carbonization is conducted substantially at 500–900 degrees C. in an inert gas.

6. The composition in accordance with claim 1 further comprising a thermally conductive filler that is electrically insulative.

7. The composition in accordance with claim 6, wherein the thermally conductive filler is selected from the group consisting of aluminum oxide, magnesium oxide, boron nitride, aluminum nitride, silicon nitride, silicon carbide and aluminum hydroxide.

8. The composition in accordance with claim 1, wherein the composition is grease.

9. The composition in accordance with claim 1, wherein the composition is an adhesive.

10. A thermally conductive molded article made by molding a thermally conductive polymer composition into a predetermined shape, the composition comprising:
    a polymer matrix;
    graphitized carbon fibers as a thermally conductive filler,
        wherein the fibers are obtained by spinning, infusibilizing and carbonizing the mesophase pitch before pulverizing,
        wherein the graphitized carbon fibers have a density of 2.20–2.26 g/cm$^3$ and a thermal conductivity in an axial direction of the fiber of at least 400W/mK.

11. The molded article in accordance with claim 10, wherein the molded article is a sheet.

12. The molded article in accordance with claim 10, wherein the molded article is a housing.

13. A method for producing graphitized carbon fibers comprising:
- spinning a mesophase pitch into spun fibers;
- infusibilizing the spun fibers to form infusibilized fibers;
- carbonizing the infusibilized fibers to form carbonized fibers;
- pulverizing the carbonized fibers to form pulverized fibers; and
- graphatizing the pulverized fibers to form graphitized carbon fibers,
  wherein the graphitized carbon fibers have a density of 2.20–2.26 g/cm$^3$ and a thermal conductivity in an axial direction of the fiber of at least 400W/mK.

14. The method in accordance with claim 13, wherein the carbonization is conducted substantially at 500–900 degrees C. in an inert gas.

* * * * *